United States Patent
Morosawa

[11] Patent Number: 6,018,182
[45] Date of Patent: Jan. 25, 2000

[54] INSULATING GATE FIELD EFFECT SEMICONDUCTOR DEVICE AND METHOD OF MANUFACTURING THE SAME

[75] Inventor: Narihiro Morosawa, Nara, Japan

[73] Assignee: Sharp Kabushiki Kaisha, Osaka, Japan

[21] Appl. No.: 08/859,100

[22] Filed: May 20, 1997

[30] Foreign Application Priority Data

May 20, 1996 [JP] Japan ..................................... 8-124480

[51] Int. Cl.$^7$ ........................... H01L 27/01; H01L 27/12; H01L 31/0392
[52] U.S. Cl. ........................... 257/347; 257/350; 257/354
[58] Field of Search .................................. 257/635, 347, 257/350–351, 345–354; 438/287

[56] References Cited

U.S. PATENT DOCUMENTS

| | | | |
|---|---|---|---|
| 4,973,540 | 11/1990 | Machida et al. | 430/110 |
| 5,286,344 | 2/1994 | Blalock et al. | 156/657 |
| 5,382,533 | 1/1995 | Ahmad et al. | 437/24 |
| 5,512,494 | 4/1996 | Tanabe | 438/161 |
| 5,521,424 | 5/1996 | Ueno et al. | 257/632 |
| 5,583,369 | 12/1996 | Yamazaki et al. | 257/635 |
| 5,712,208 | 1/1998 | Tseng et al. | 438/287 |
| 5,714,788 | 2/1998 | Ngaoaram | 438/287 |

FOREIGN PATENT DOCUMENTS 790589  4/1995  Japan .

OTHER PUBLICATIONS

The Effect of Fluorine in Silicon Dioxide Gate Dielectrics. Wright et al. IEEE Transactions on Electron Devices, vol. 36, No. 5, May 1989.
English Language Abstract of JP–A–7–90589.
Journal of Applied Physics, vol. 60 (9) p. 3136 (1986).
Journal of Vacuum Science Technology A5 (4) p. 2231 (1987).
IEEE Trans. Electron Devices, vol. 36, No. 9, p. 1929 (1989).

*Primary Examiner*—Alexander Oscar Williams
*Assistant Examiner*—Cuong Quang Nguyen

[57] ABSTRACT

An insulating gate field effect semiconductor device having a gate insulating film of high resistance to moisture adsorption, wherein trap densities in the gate insulator film and at the interface between a channel semiconductor film and the gate insulator film are lowered, and causing no degradation of device characteristics and no lowering of reliability are caused. A $SiO_2$ film including fluorine atoms is used as the gate insulator film to compensate defects in the gate insulator film and at the interface between the channel semiconductor film and the gate insulator film.

11 Claims, 2 Drawing Sheets

6,018,182

INSULATING GATE FIELD EFFECT SEMICONDUCTOR DEVICE AND METHOD OF MANUFACTURING THE SAME

TITLE OF THE INVENTION

Insulating gate field effect semiconductor device and method of manufacturing the same.

BACKGROUND OF THE INVENTION

The present invention relates to an insulating gate field effect semiconductor device and a method of manufacturing the same, and more specifically to an insulating gate semiconductor device which can be fabricated by a low temperature process and a method of manufacturing the same.

In recent years, fabrication of semiconductor devices with thin film transistors (TFT) provided on a large area of low cost glass substrate are required in order to reduce the cost of display devices, image sensors or the like. When the glass substrate is used, a low temperature process of approximately 600° C. is needed to prevent softening of the glass substrate.

For example, when a polysilicon or amorphous silicon layer is used as a channel semiconductor film and a silicon dioxide($SiO_2$) film as a gate insulator film for the TFT, in order to keep the heat treatment temperature for fabricating the TFT below 600° C., the following deposition techniques are employed due to possibility of a low temperature deposition of $SiO_2$ film as a gate insulator film. The deposition techniques are piling techniques like plasma chemical vapor deposition (CVD) (for example, refer to Journal of Applied Physics Vol.60(9) p3,136 (1986)), remote plasma CVD (for example, refer to Journal of Vacuum Science Technology A5(4) p2,231 (1987)), AP(Atmospheric Pressure) CVD, LP(Low Pressure) CVD, sputtering (for example, refer to IEEE Trans. Electron Devices 135(12) p3104 (1989)) or the like.

By using these film deposition techniques, however, a dense $SiO_2$ film is difficult to obtain. Accordingly, to densify the deposited $SiO_2$ film, a high temperature annealing at approximately 900° C. or a lamp annealing in a nitrogen ambient is considered. That is, to form a high quality gate insulator film by any technique, a heat treatment at a temperature higher than 600° C. is considered necessary. The above described $SiO_2$ film is not so dense and becomes hygroscopic after the succeeding process, especially after the densifying anneal at a temperature of approximately 600° C., degrading the characteristics and lowering reliability of the TFT.

In deposition of a $SiO_2$ film by plasma CVD, introduction of a gas including fluorine together with an organosilane and oxidizing gas is disclosed (Japanese Unexamined Patent Publication JP-A 7-90589(1995)). To improve the film property, however, control of fluorine content in the oxide film to a constant value is required, and therefore some special apparatus is needed.

As described above, a high quality gate insulator film can be obtained at a relatively high deposition temperature. Application of a glass substrate for film deposition, however, requires a low temperature process of approximately 600° C. On the other hand, when a gate insulator film is deposited at a temperature lower than 600° C., a dense and high quality film could not be obtained. Because the film adsorbs moisture after the succeeding process, high level of traps are introduced to the gate insulator film and channel interface giving a harmful influence to the TFT characteristics. These traps cause injection of hot electrons and reliability problems to the device.

SUMMARY OF THE INVENTION

The present invention is made for solving the above-mentioned problems of the conventional techniques. An object of the invention is to provide an insulating gate field effect semiconductor device which does not cause degradation of device characteristics and lowering of reliability by forming a dense and high quality gate insulator film at a low temperature gate insulator film which shows little moisture adsorption during the process after the deposition.

To achieve the object, the present invention provides an insulating gate field effect semiconductor device comprising:

a semiconductor film;

a gate insulator film; and a gate electrode, the semiconductor film, the gate insulator film, and the gate electrode being deposited on an insulator substrate in this order from the insulator substrate's side, the gate insulator film being composed of a $SiO_2$ layer including fluorine atoms.

The semiconductor film may have source and drain regions to form a thin film transistor.

In the invention it is preferable that the fluorine concentration in the $SiO_2$ layer of the gate insulator film is 1% to 3%.

According to the invention, application of the $SiO_2$ film including fluorine atoms to the gate insulator film prevents the moisture adsorption in the succeeding process, and the fluorine atoms compensate the defects existing in the gate insulator film and at the interface between the channel semiconductor and the gate insulator film, and hence the trap density in the gate insulator film and at the interface between the channel semiconductor and the gate insulator film is reduced, and the device becomes highly resistant to hot electron injection preventing degradation of the device characteristics and lowering of reliability.

As being clear from the above explanation, according to the invention, application of the $SiO_2$ film including fluorine atoms to the gate insulator can prevent moisture adsorption by the gate insulator film in the succeeding process, and reduce defect density in the gate insulator film and at the interface between the channel semiconductor and the gate insulator film. And hence degradation of the TFT characteristics including Vth and S factor are prevented.

Further, as the defects in the gate insulator film and at the interface between the channel semiconductor and gate insulator film are compensated by fluorine atoms, TFT being highly resistant to hot electron injection and of high reliability can be obtained.

To achieve the object, the invention provides a method of manufacturing the insulating gate field effect semiconductor comprising at least the steps of:

forming a semiconductor film upon an insulator substrate;

forming a gate insulator film upon the semiconductor film; and forming a gate electrode upon the gate insulator film, wherein the step of forming a gate insulator is conducted by adding a gas including fluorine atoms to a source material gas.

According to the manufacturing method of the invention, the $SiO_2$ film including fluorine atoms is formed by adding a gas including fluorine atoms to the source material gas, and since the defects in the SiO$_2$ film are compensated at the step of film deposition, annealing at a temperature higher than 600° C. to densify the SiO$_2$ film is not needed after the SiO$_2$ film is formed with the result that the number of process step can be decreased.

The SiO$_2$ film including fluorine atoms is formed by adding a gas including fluorine atoms to the source material gas which has been used in forming a conventional SiO$_2$ film, and no additional process step is needed. Consequently manufacturing is possible by using conventional facilities.

As the gate insulator film can be formed at a low temperature, the TFT can be fabricated by a low temperature process. Consequently no problem of thermal stress occurs and TFT can be fabricated in a relatively large area of display, image sensor or the like on by using a substrate of glass or other material.

To achieve the object, the invention provides a method of manufacturing an insulating gate field effect semiconductor device comprising at least the steps of;

forming a semiconductor film upon an insulator substrate;

forming a gate insulator film upon the semiconductor film; and forming a gate electrode upon the gate insulator film, wherein the step of forming a gate insulator is conducted by adding a gas including fluorine atoms to the source material gas, and steps after the step of forming a gate insulator film are conducted by heat treatment at a temperature lower than 400° C.

Further the heat treatment after forming the gate insulator film is conducted at a temperature lower than 400° C. desirably.

Further, after the gate insulator film is formed, all the succeeding process steps are conducted at temperatures lower than 400° C., and hence the TFT can be fabricated in a large area of display, image sensor or the like using a substrate of glass and other material without problem including thermal stress.

Further, since no annealing step is needed after the gate insulator film is formed, the fabrication process can be simplified and TFT throughput can be improved.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
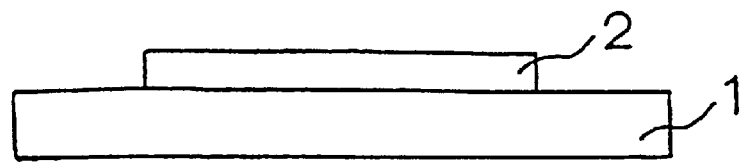
FIGS. 1A through 1E are sectional views showing a manufacturing process of a gate insulator film and TFT according to an embodiment of the invention.

Now referring to the drawings, preferred embodiments of the invention are described below.

An insulating gate field effect semiconductor device of the invention is fabricated by forming a semiconductor film and a gate electrode on an insulator substrate with a gate insulator film intervening between the semiconductor film and the gate electrode.

The gate insulator film is formed with a SiO$_2$ film including fluorine atoms.

The gate insulator film is approximately 100 nm thick commonly, and 50 to 150 nm desirably. In the case of gate isolator film thinner than 50 nm, the effect of gate isulator film is lost giving a harmful influence on the TFT characteristics. On the other hand, in the case of gate insulator film thicker than 150 nm, the Vth value of the TFT could be too high.

The concentration of fluorine atom in the gate insulator film is desirably 1% to 3%. In the case of fluorine atom concentration in the gate insulator film lower than 1%, no compensation effect is obtained on the defects developed in the gate insulator film and at the interface between the channel semiconductor film and the gate insulator film, and hence no improvement of the device characteristics could be obtained. On the other hand, in the case of fluorine atom concentration in the gate insulator film higher than 3%, the S factor of the TFT could be too high.

The gate insulator film can be deposited at a temperature lower than 600° C. by means of plasma CVD, remote plasma CVD, AP CVD, LPCVD, ECR CVD or sputtering.

The gate insulator film is obtained as a deposited SiO$_2$ film including fluorine atoms by adding such a gas as carbon tetrafluoride (CF$_4$), fluorine or the like on to the source material gas.

As the gate insulator film obtained in above manner is composed of SiO$_2$ film including fluorine atoms, moisture adsorption can be prevented in the succeeding process leading to the improved characteristics and higher reliability of the device.

The gate insulator film can be used as a gate insulator film for TFT or as a gate insulator film for capacitors. In the case of application to TFT, for example, because the moisture adsorption is improved, it is possible to obtain a favorable TFT characteristics with a low value of S factor and threshold voltage(Vth). And, because the defect density in the gate insulator film and at the interface between the channel semiconductor and the gate insulator film can be reduced, TFT highly resistant to hot electron injection can be obtained leading to an improved reliability of the device.

As the insulator substrate, a glass substrate of high strain point temperature resistible to a heat treatment at about 600° C., a quartz substrate or the like can be used.

As the semiconductor film, a semiconductor comprising silicon such as polysilicon, amorphous silicon, single crystalline silicon, or silicon germanium can be used.

In the case of fabricating a TFT, source and drain regions are formed in the semiconductor film as a channel. And, doping appropriate amount of impurity to control Vth value to the semiconductor film just under the gate insulator film is possible.

As the gate electrode, tantalum (Ta) and such a metal including aluminum(Al) as Al, AlSi, AlTi, and AlSc can be used.

Figure 1B:
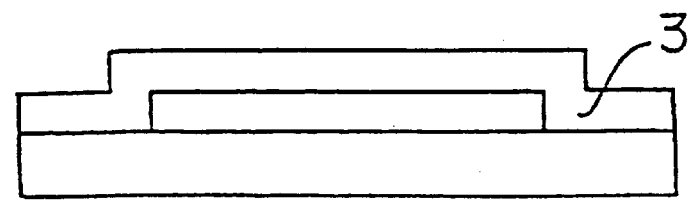
Figure 1C:
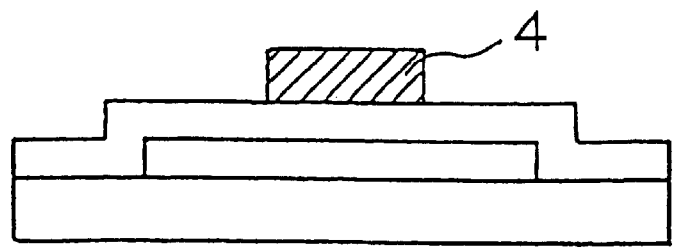
Figure 1D:
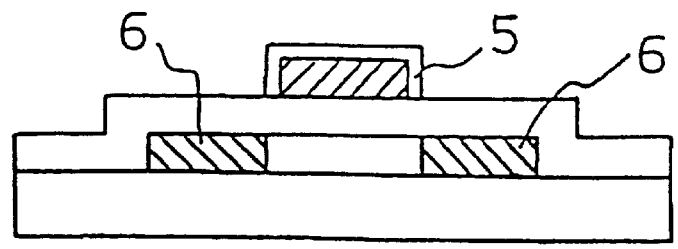
Figure 1E:
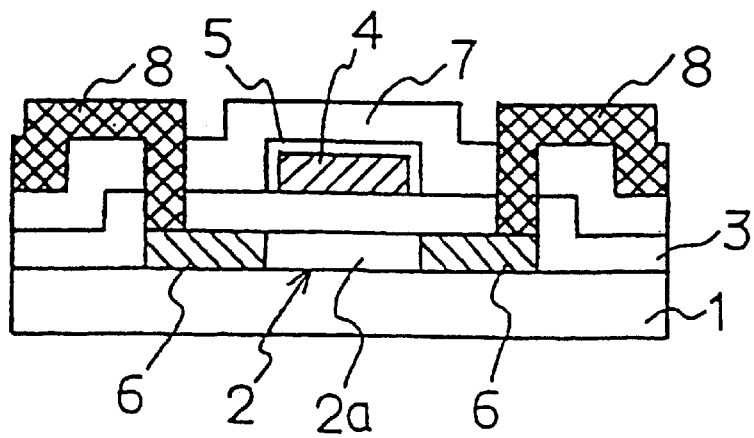

FIG. 1E illustrates a cross sectional view of the TFT showing an example of an embodiment of the invention. The TFT uses the polysilicon layer as the channel semiconductor.

A polysilicon layer 2 having a channel region 2a and source and drain regions 6 is formed in the shape of island on a glass substrate 1, and a gate insulator film 3 is formed covering the polysilicon island. The gate insulator film 3 is formed of SiO$_2$ layer including fluorine atoms. Upon the gate insulator film 3 a gate electrode 4 and an anodic oxide film 5 of the gate electrode 4 are formed opposing to the channel region 2a, and then an interlayer insulating film 7 is formed so as to cover the anodic oxide film 5. An interconnection electrode 8 is formed upon the interlayer insulating film 7 and connected electrically with the source and drain region 6 at a contact hole opened in the gate insulator film 3 and the interlayer insulating film 7.

This TFT can be fabricated as following.

At first, referring to FIG. 1A, the semiconductor film 2 is formed on the insulating substrate 1. According to an example of the embodiment, an amorphous silicon film of approximately 50 nm thick is formed on the glass substrate 1 of high strain point temperature and high resistance to a heat treatment at approximately 600° C. by LPCVD technique at a substrate temperature of approximately 450° C. using disilane($Si_2H_6$) gas. The amorphous silicon film was converted to a polysilicon film by annealing at a substrate temperature of 400° C. by means of Excimer laser with a laser power of approximately 250 mj/cm$^2$. The polysilicon film thus obtained is patterned in a desired island shape by etching to form the semiconductor film 2.

Prior to deposition of the amorphous silicon film on the glass substrate 1, and in order to prevent impurities from diffusing out of the substrate, a coating film of about 500 nm thick such as $SiO_2$ film and silicon nitride film may be formed on the glass substrate 1 by means of sputtering or plasma CVD. Further, the deposition method for the amorphous silicon film is not limited to LPCVD and could be plasma CVD. As a laser used in laser annealing may be used any Excimer laser of XCl, ArF and KrF. Further, prior to laser annealing, the amorphous silicon film may be converted to polysilicon by solid state growth at a temperature of 600° C. in a nitrogen ambient.

Next, referring to FIG. 1B, a $SiO_2$ film including fluorine atoms is formed as the gate insulator film 3 on the semiconductor film 2. In the present embodiment, the $SiO_2$ film 3 including fluorine atoms is formed by means of plasma CVD using Tetra-Ethyl-Ortho-Silicate, $Si(OC_2H_5)_4$ (TEOS) gas and $CF_4$ gas to a thickness of about 50 to 150 nm, for example to 100 nm. The condition for depositing film by means of plasma CVD is the substrate temperature of 300° C., the reaction pressure of 1.0 Torr, the TEOS flow rate of 5 sc cm, the $O_2$ flow rate of 200 sc cm, the $CF_4$ flow rate of 20 sc cm and the RF power of 200 W. In case where the deposition at low temperature is possible, the $SiO_2$ film 3 including fluorine atoms can be formed by remote plasma CVD, ECR CVD, LPCVD, APCVD, sputtering or the like. In place of TEOS gas, $SiH_4$ and $O_2$ gas can be used for film deposition. In place of $CF_4$ gas, a gas including fluorine atoms such as $F_2$ may be used.

Next, referring to FIG. 1C, the gate electrode 4 is formed on the gate insulator film 3. In the present embodiment, an AlTi film is deposited by sputtering to a thickness of approximately 400 nm on the gate insulator film 3 and subjected to patterning to a desired shape to form the gate electrode 4. The gate electrode 4 can use such a metal as Ta, Al, AlSi, or AlSc.

Next, referring to FIG. 1D, the anodic oxide film 5 is formed by anodic oxidizing on the surface of the gate electrode 4. According to the present embodiment, thickness of the anodic oxide film 5 is 50 to 500 nm.

Continuously, impurity elements (phosphorus for N channel and boron for P channel) are introduced into the semiconductor film 2 by self-aligned doping, masking with the gate electrode 4 and the anodic oxide film 5 to form the source and drain regions 6. In the present embodiment, the phosphorus ion as an impurities element dose of approximately 1 to $5\times10^{15}$ ion/cm$^2$ was implanted at an energy of 10 to 100 KeV. By subjecting the doped impurities to laser activation at a room temperature and a power of approximately 300 mJ/cm$^2$, the source and drain regions 6 are formed.

Thereafter, referring to FIG. 1E, the interlayer insulating film 7 is formed covering the gate electrode 4 and the anodic oxide film 5. In the present embodiment, $SiO_2$ film of approximately 400 nm thickness is formed as an interlayer insulating film 7 by means of plasma CVD or APCVD using TEOS gas. Next, contact holes are opened in the gate insulator film 3 and the interlayer insulating film 7 over the source and drain region 6, and the interconnection electrode 8 is formed on the interlayer insulating film 7 to complete the fabrication of the TFT. In the present embodiment, the interconnection electrode 8 was formed using aluminum. Then, after a protection film of silicon nitride or $SiO_2$ film is formed by means of plasma CVD and the contact hole is etched off, aiming at reducing the polysilicon defects, the polysilicon is subjected to hydrogenating in a nitrogen ambient at a temperature of approximately 300° C. for one hour.

Figure 2:
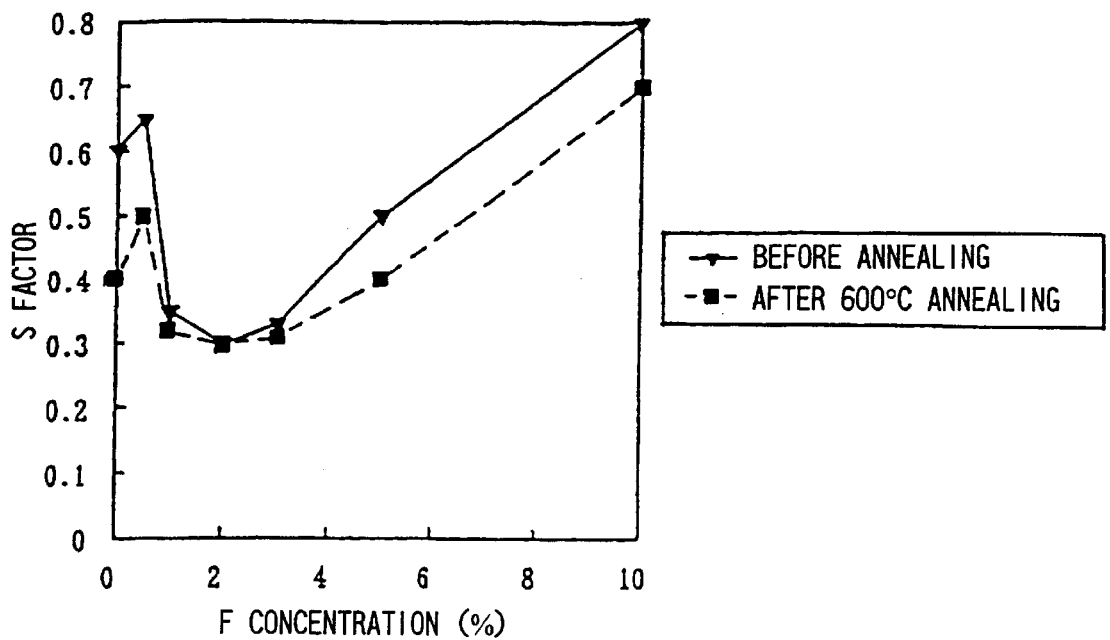
FIG. 2 is a chart explaining a dependence of S factor on the fluorine concentration as one of the TFT characteristics before and after the annealing step according to the embodiment of the invention and a comparative example.

The relation between the fluorine atom concentration and the S factor of the TFT obtained by above described fabrication process is shown in FIG. 2. And, for example, the characteristics of the TFT for which only the $SiO_2$ film deposited by means of plasma CVD is used as a gate insulator film is shown, and the characteristics of TFT with and without annealing of gate insulator film at a temperature of 600° C. are shown simultaneously.

As being clear from FIG. 2, in the case of no annealing process, TFT with the gate insulator film of $SiO_2$ film including fluorine atoms has S factor value lower than that of TFT with the gate insulator film of pure $SiO_2$. That is resulted from the reduced defect density in the gate insulator film and at the interface of channel semiconductor and gate insulator film by making the gate insulator film include fluorine atoms. And it is understood that the TFT with the gate insulator film of $SiO_2$ film including fluorine atoms and being subjected to no annealing process has better characteristics than the TFT with gate insulator film of pure $SiO_2$ film subjected to annealing process in a nitrogen ambient at a temperature of 600° C. for a duration of 12 hours.

Figure 3:
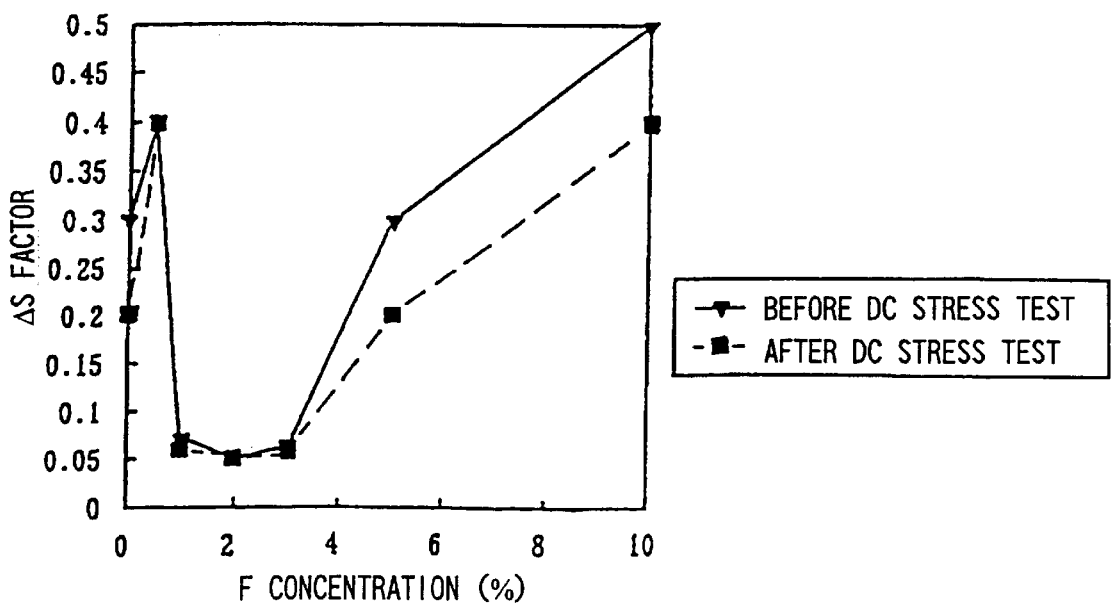
FIG. 3 is a chart explaining a dependence of S factor on the fluorine concentration as one of the TFT characteristics before and after the DC stress test according to the embodiment of the invention and the comparative example.

FIG. 3 illustrates a change of S factor before and after a DC bias stress test applied to TFTs and gate insulator films in the present embodiment and a comparison, with a condition of gate bias field of 7 MV/cm, ambient temperature of 150° C., and a duration of 1000 seconds.

As being clear from FIG. 3, the TFT with the gate insulator film of $SiO_2$ film including fluorine atoms shows smaller change of S factor comparing with the TFT with gate insulating film of pure $SiO_2$ layer, and proves to have higher reliability.

Further, with respect to the degradation of S factor as it is learned from a simulation result that the change of S factor should be controlled to less than 20%, and considering the results of FIGS. 2 and 3, the fluorine atom concentration in the gate insulator film should be desirably 1% to 3%.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An insulating gate field effect semiconductor device comprising:

a semiconductor film;

a gate insulator film; and a gate electrode, the semiconductor film, the gate insulator film, and the gate electrode being deposited over an insulator substrate in this order from the insulator substrate's side, the gate insulator film being deposited at a temperature less than about 600° C. and having a $SiO_2$ layer including fluorine atoms at a concentration of about 1% to 3%.

2. The insulating gate field effect semiconductor device of claim 1, wherein the semiconductor film has source and drain regions to form a thin film transistor.

3. The insulating gate field effect semiconductor device of claim 2, further comprising an anodic oxide film formed over the gate electrode.

4. The insulating gate field effect semiconductor device of claim 3, further comprising an interlayer insulating film formed over the gate insulator film and the anodic oxide film.

5. The insulating gate field effect semiconductor of claim 4, further comprising an interconnection electrode formed over the interlayer insulating film that connects to one of the source and drain regions.

6. The insulating gate field effect semiconductor device of claim 1, wherein the insulator substrate is substantially glass.

7. The insulating gate field effect semiconductor device of claim 3, wherein a portion of the gate insulator field is deposited over the semiconductor film, and another portion of the gate insulator film is deposited over a substrate other than the semiconductor film.

8. The insulating gate field effect semiconductor device of claim 1, wherein the insulator substrate is substantially quartz.

9. The insulating gate field effect semiconductor device of claim 8, wherein a portion of the gate insulator field is deposited over the semiconductor film, and another portion of the gate insulator film is deposited over a substrate other than the semiconductor film.

10. The insulating gate field effect semiconductor device of claim 1, wherein a portion of the gate insulator field is deposited over the semiconductor film, and another portion of the gate insulator film is deposited over a substrate other than the semiconductor film.

11. The insulating gate field effect semiconductor of claim 1, wherein a change in an S factor is less than 20%.

* * * * *